United States Patent
Yu et al.

(10) Patent No.: US 12,364,026 B2
(45) Date of Patent: Jul. 15, 2025

(54) BARRIER-TYPE PHOTOVOLTAIC WELDING STRIP CAPABLE OF REDUCING DAMP-HEAT ATTENUATION

(71) Applicants: Zhejiang Jinko Solar Co., Ltd., Zhejiang (CN); Jinko Solar Co., Ltd., Jiangxi (CN)

(72) Inventors: Kun Yu, Zhejiang (CN); Changming Liu, Zhejiang (CN); Xinyu Zhang, Zhejiang (CN); Beibei Gao, Zhejiang (CN); Zengzhi Ma, Zhejiang (CN)

(73) Assignees: Zhejiang Jinko Solar Co., Ltd., Zhejiang (CN); Jinko Solar Co., Ltd., Jiangxi (CN)

( * ) Notice: Subject to any disclaimer, the term of this patent is extended or adjusted under 35 U.S.C. 154(b) by 381 days.

(21) Appl. No.: 17/926,477

(22) PCT Filed: Jun. 10, 2020

(86) PCT No.: PCT/CN2020/095298
§ 371 (c)(1),
(2) Date: Jan. 6, 2023

(87) PCT Pub. No.: WO2021/232511
PCT Pub. Date: Nov. 25, 2021

(65) Prior Publication Data
US 2023/0131984 A1    Apr. 27, 2023

(30) Foreign Application Priority Data
May 20, 2020   (CN) .......................... 202010430368.7

(51) Int. Cl.
*H10F 19/90*     (2025.01)
*H10F 19/80*     (2025.01)

(52) U.S. Cl.
CPC ........... *H10F 19/90* (2025.01); *H10F 19/804* (2025.01)

(58) Field of Classification Search
None
See application file for complete search history.

(56) References Cited

U.S. PATENT DOCUMENTS

2005/0241692 A1 * 11/2005 Rubin ................. H01L 31/0512
                                                                    136/252
2012/0184697 A1    7/2012 Samuels et al.
2014/0332057 A1   11/2014 Tung et al.

FOREIGN PATENT DOCUMENTS

| CN | 102214731 | 4/2013 |
|----|-----------|--------|
| CN | 203085560 U | 7/2013 |

(Continued)

OTHER PUBLICATIONS

English language machine translation of (CN 108470792 A). (Year: 2024).*

(Continued)

*Primary Examiner* — Eli S Mekhlin
(74) *Attorney, Agent, or Firm* — Burris Law, PLLC

(57) ABSTRACT

Disclosed is a barrier-type photovoltaic solder strip capable of reducing damp-heat (DH) attenuation, the photovoltaic solder strip comprising a photovoltaic solder strip body. A moisture barrier layer is arranged on a surface of the photovoltaic solder strip body that is not in contact with an electrode of a solar cell, and the moisture barrier layer can prevent external water and gas from entering the photovoltaic solder strip body, thus, on the basis of low cost, corrosion of the photovoltaic solder strip body by acidic substances, oxidizing agents and water in a module is reduced, thereby reducing attenuation of a photovoltaic module in a DH environment.

7 Claims, 1 Drawing Sheet

(56) References Cited

FOREIGN PATENT DOCUMENTS

| | | |
|---|---|---|
| CN | 103254802 A | 8/2013 |
| CN | 103824892 A | 5/2014 |
| CN | 203826404 U | 9/2014 |
| CN | 107312473 A | 11/2017 |
| CN | 107393994 A | 11/2017 |
| CN | 108470792 | 8/2018 |
| CN | 108470792 A * | 8/2018 |
| CN | 109616540 A | 4/2019 |
| CN | 111069918 A | 4/2020 |
| JP | 2010087060 A | 4/2010 |
| KR | 1020190028892 A | 3/2019 |

OTHER PUBLICATIONS

International Search Report issued in corresponding International Application PCT/CN2020/095298, mailed Feb. 22, 2021.
Office Action issued in corresponding CN Application 202010430368.7, issued May 27, 2021, and an English Translation, 11 pages.
Extended European Search Report issued in corresponding EP Application 20937145.9, issued Jun. 7, 2024, 8 pages.

* cited by examiner

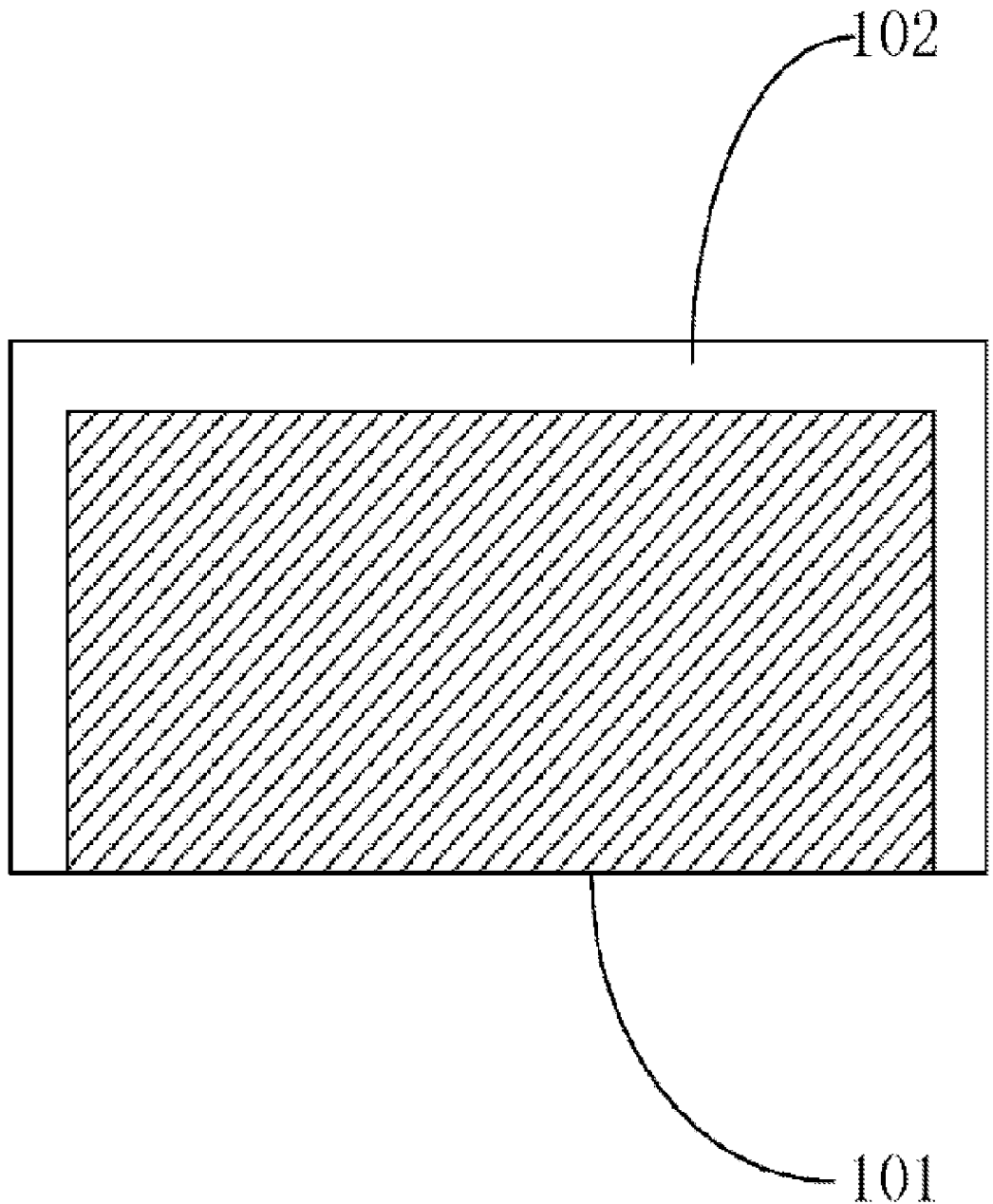

BARRIER-TYPE PHOTOVOLTAIC WELDING STRIP CAPABLE OF REDUCING DAMP-HEAT ATTENUATION

CROSS-REFERENCE TO RELATED APPLICATIONS

This application is a National Phase of International Application No. PCT/CN2020/095298, filed on Jun. 10, 2020, which claims priority to Chinese Patent Application No. 202010430368.7, filed on May 20, 2020, the entire contents of which are incorporated herein by reference.

FIELD

The present disclosure belongs to the technical field of photovoltaic devices, and in particular, to a barrier-type photovoltaic solder strip capable of reducing damp-heat (DH) attenuation.

BACKGROUND

The statements in this section merely provide background information related to the present disclosure and may not constitute prior art.

A photovoltaic solder strip is an important raw material used in a soldering process of a photovoltaic module. In a manufacturing process of the photovoltaic module, a current of a solar cell is derived by using a solder strip in the soldering process, and then extracted led out electrode forms an effective connection in series or in parallel to a junction box. Distinguished by components, solder strips are divided into leaded solder strips and lead-free solder strips. When the photovoltaic module has been operated in an outdoor environment for a long time, especially in a high-temperature and high-humidity environment, packaging materials of the photovoltaic module may slowly deteriorate, resulting in corrosion of internal metal components, which is mainly reflected in electrochemical corrosion of the solder strip and a metallized electrode of the photovoltaic cell, leading to poor electrical performance and greater power attenuation of the photovoltaic module.

A crystalline silicon photovoltaic module may be prone to corrosion, delamination, fading, and other failure situations under the action of temperature and humidity, in which case testing is required. A DH attenuation test is generally used. That is, in an aging test chamber of the photovoltaic module, under 85° C., 85% relative humidity (RH) for 1000 h, if a power attenuation ratio of the photovoltaic module is less than 5%, the photovoltaic module meets desired quality requirement. If the photovoltaic module undergoes DH3000 or longer, the attenuation becomes significantly larger, and ethylene vinyl acetate (EVA) in a blackened region of the failed module shows a characteristic peak of lead acetate near $-1574$ $cm^{-1}$ and $-3500$ $cm^{-1}$. A main source of lead is lead contained in a copper solder strip containing lead tin and a glass material in the electrode of the photovoltaic cell. In addition, a silver oxide and other substances are found in the electrode of the solar cell. The above indicates that DH failure is caused by corrosion of metal components by acetic acid or oxides generated within the photovoltaic module in the high-temperature and high-humidity environment. When the crystalline silicon photovoltaic module is in the high-temperature and high-humidity environment, water and oxygen in the air enter the interior of the photovoltaic module through a back sheet, and the material is aged and hydrolyzed to produce acetic acid or oxidizing gas enters the interior, which corrodes the metal components such as the solder strip and the electrode, resulting in degradation of electrical performance of the photovoltaic module and an increase in the power attenuation.

Existing solutions are based on reduction of generation of acetic acid, including using a double-glazed module to reduce moisture permeability and reduce a hydrolysis rate of an EVA material, and using a molecular polymeric material such as polyolefin elastomer (POE), whose hydrolysates do not contain acetic acid and other substances and have lower water permeability. Another solution is to reduce an amount of accumulation of hydrolyzed acids in the interior, that is, to use a transparent back sheet module, so that, when an operating temperature is higher than an ambient temperature, internal small acetic acid molecules can escape from the module to avoid accumulation of acetic acid concentration. Another solution closest to the above solution is to add materials to the module to achieve consumption of acetic acid. For example, in the solutions of publication numbers CN107312473A and CN103254802A, a metal compound is added to an EVA adhesive film as an acetic acid scavenger to consume acetic acid, so as to prevent the corrosion of metal components by acetic acid. However, this method has disadvantages. Since the added metal compound requires use of rare-earth elements and the EVA has a large area, the amount of rare earth is relatively large, and the cost is excessively high.

SUMMARY

In order to solve the above problems, the present disclosure provides a barrier-type photovoltaic solder strip capable of reducing DH attenuation, which can reduce, on the basis of low cost, corrosion of the photovoltaic solder strip body by acidic substances, oxidizing agents and water in a module, thereby reducing attenuation of a photovoltaic module in a DH environment.

The present disclosure provides a barrier-type photovoltaic solder strip capable of reducing DH attenuation, including a photovoltaic solder strip body, a moisture barrier layer is provided on a surface of the photovoltaic solder strip body that is not in contact with an electrode of a solar cell.

In some embodiments, a material of the moisture barrier layer comprises at least one of fluorocarbon resin, polyvinyl fluoride (PVF), polyvinylidene fluoride (PVDF), an ethylene-chlorotrifluoroethylene copolymer (ECTFE), a tetrafluoroethylene-vinyl ester copolymer, a tetrafluoroethylene-hexafluoropropylene-vinylidene fluoride copolymer (THV), polypropylene, and polystyrene.

In some embodiments, the material of the moisture barrier layer comprises THV with a mass percentage in a range of 20% to 55%, PVDF with a mass percentage in a range of 10% to 45%, PVF with a mass percentage in a range of 20% to 35%, and ECTFE with a mass percentage in a range of 10% to 30%.

In some embodiments, a thickness of the moisture barrier layer ranges from 1 μm to 50 μm.

In some embodiments, the thickness of the moisture barrier layer ranges from 10 μm to 20 μm.

In some embodiments, when the photovoltaic solder strip body has a triangular section, the moisture barrier layer is wrapped around two surfaces of the photovoltaic solder strip body, when the photovoltaic solder strip body has a circular section, the moisture barrier layer is wrapped around at least three quarters of the photovoltaic solder strip body, and when the photovoltaic solder strip body has a rectangular section, the moisture barrier layer is wrapped around two minor surfaces and one major surface of the photovoltaic solder strip body.

DRAWINGS

In order to better illustrate the technical solutions in the embodiments of the present disclosure or the related art, the accompanying drawings used in the description of the embodiments or the related art will be briefly introduced below. It is apparent that, the accompanying drawings in the following description are only some embodiments of the present disclosure, and other drawings can be obtained by those of ordinary skill in the art from the provided drawings without creative efforts.

In order that the disclosure may be well understood, there will now be described various forms thereof, given by way of example, reference being made to the accompanying drawings, in which:

FIG. 1 is a schematic diagram of a barrier-type photovoltaic solder strip capable of reducing DH attenuation according to some embodiments of the present disclosure.

Further areas of applicability will become apparent from the description provided herein. It should be understood that the description and specific examples are intended for purposes of illustration only and are not intended to limit the scope of the present disclosure.

DETAILED DESCRIPTION

The gist of the present disclosure is to provide a barrier-type photovoltaic solder strip capable of reducing DH attenuation, which can reduce, on the basis of low cost, corrosion of the photovoltaic solder strip body by acidic substances, oxidizing agents and water in a module, thereby reducing attenuation of the photovoltaic module in the DH environment.

The technical solutions in the embodiments of the present disclosure will be described below with reference to the accompanying drawings in the embodiments of the present disclosure. It is appreciated that, the described embodiments are merely some of rather than all of the embodiments of the present disclosure. All other embodiments acquired by those skilled in the art without creative efforts based on the embodiments of the present disclosure shall fall within the protection scope of the present disclosure.

A barrier-type photovoltaic solder strip capable of reducing DH attenuation according to the present disclosure is shown in FIG. 1. FIG. 1 is a schematic diagram of a barrier-type photovoltaic solder strip capable of reducing DH attenuation according to some embodiments of the present disclosure. The photovoltaic solder strip includes a photovoltaic solder strip body 101. A moisture barrier layer 102 is arranged on a surface of the photovoltaic solder strip body 101 that is not in contact with an electrode of a solar cell. The moisture barrier layer 102 may prevent external water and gas from entering the photovoltaic solder strip body by, for example, but not limited to, using a thin film. It is to be noted that the illustration in FIG. 1 is merely the photovoltaic solder strip body with a rectangular section, which is not limited to the photovoltaic solder strip body in this shape, other shapes may also be adopted. The moisture barrier layer 102 is arranged on two sides and a top surface of the photovoltaic solder strip body 101 with the rectangular section. The moisture barrier layer 102 here can block both water and gas, so as to ensure that the water and the gas cannot enter the photovoltaic solder strip body 101 from the two sides and the top surface of the photovoltaic solder strip body 101. A bottom surface of the photovoltaic solder strip body 101 is in contact with the electrode of the solar cell, so as to ensure electrical conduction. Therefore, there is no need to arrange the moisture barrier layer on the surface, since this surface may not be exposed to the outside, so as to ensure that the water and the gas cannot enter the photovoltaic solder strip body 101 through the bottom surface. In this way, the photovoltaic solder strip body can prevent, in an all-round manner, adverse effects caused by the entry of the water and the gas into the interior thereof.

As can be known through the above descriptions, in the embodiments of the barrier-type photovoltaic solder strip capable of reducing DH attenuation according to the present disclosure, a moisture barrier layer is arranged on a surface of the photovoltaic solder strip body that is not in contact with an electrode of a solar cell, and the moisture barrier layer can prevent external water and gas from entering the photovoltaic solder strip body. As a result, on the basis of low cost, corrosion of the photovoltaic solder strip body by acidic substances, oxidizing agents and water in a module is reduced, thereby reducing attenuation of the photovoltaic module in the DH environment.

In some embodiments of the barrier-type photovoltaic solder strip capable of reducing DH attenuation, a material of the moisture barrier layer 102 includes at least one of fluorocarbon resin, polyvinyl fluoride (PVF), polyvinylidene fluoride (PVDF), ethylene chlorotrifluoroethylene (ECTFE), a tetrafluoroethylene-vinyl ester copolymer, tetrafluoroethylene hexafluoropropylene vinylidene fluoride copolymer (THV), polypropylene, and polystyrene. These materials are existing materials, have excellent weather resistance (acid resistance, alkali resistance, high-temperature resistance) performance, and thus are more suitable for use here to prevent water and gas from entering the photovoltaic solder strip body. Each material also has its own unique advantages. For example, PVDF has a water absorption rate of 0.04%, bond energy of a chlorotrifluoroethylene-vinyl ether copolymer is more uniform, THV is soft and easy to bond and may be bonded to other materials to form a multi-layer structure without surface treatment, ECTFE has high weather resistance and barrier properties, and polypropylene and polystyrene have better water resistance and oxygen isolation effects. It is to be further noted that the material of the moisture barrier layer 102 may be one, two, three, or more of the above materials, which is not limited herein.

In some embodiments of the barrier-type photovoltaic solder strip capable of reducing DH attenuation, the material of the moisture barrier layer 102 includes THV with a mass percentage in a range of 20% to 55%, PVDF with a mass percentage in a range of 10% to 45%, PVF with a mass percentage in a range of 20% to 35%, and ECTFE with a mass percentage in a range of 10% to 30%.

In some embodiments of the barrier-type photovoltaic solder strip capable of reducing DH attenuation, a thickness of the moisture barrier layer 102 may range from 1 μm to 50 μm. In this case, transmittance may reach 85% to 95%, and a melting point temperature of the moisture barrier layer may reach 240° C. to 270° C., which can ensure that the moisture barrier layer may not be damaged in the soldering process.

In some embodiments, the thickness of the moisture barrier layer may range from 10 μm to 20 μm. For example, firstly, the materials are weighed and prepared into a thin film or granular material, which is melted at 240° C. to 300° C. in a nitrogen atmosphere and stirred to form a uniform mixture. Then, in a heating state, local protection may be formed by using a mold or partial bonding or spraying a high-temperature non-stick material. The moisture barrier layer is soldered together with a metal electrode of the photovoltaic cell by using a stringer and a solder strip turn-over device, and finally dried and cooled to ensure that soldering tension is qualified. In this way, the photovoltaic solder strip body is bonded with the moisture barrier layer.

In some embodiments of the barrier-type photovoltaic solder strip capable of reducing DH attenuation, when the photovoltaic solder strip body has a triangular section, the moisture barrier layer is wrapped around two surfaces of the photovoltaic solder strip body, and a third surface is directly in contact with the electrode of the solar cell, so there is no need to arrange the moisture barrier layer. When the photovoltaic solder strip body has a circular section, the moisture barrier layer is wrapped around at least three quarters of the photovoltaic solder strip body, and the remaining one quarter is in contact with the electrode of the solar cell, so there is no need to arrange the moisture barrier layer. When the photovoltaic solder strip body has a rectangular section, the moisture barrier layer is wrapped around two minor surfaces and one major surface of the photovoltaic solder strip body. Herein, the minor surfaces are side surfaces, and the major surface is a top surface. Since a bottom surface is in contact with the electrode of the solar cell, there is no need to arrange the moisture barrier layer. In this way, effective shielding can be formed according to an actual situation to ensure that external water and gas cannot enter the photovoltaic solder strip body, and other wrapping manners may also be selected according to an actual requirement, which is not limited herein.

The following is a detailed description of steps of a method for manufacturing the above photovoltaic solder strip. (1) Copper-based feeding: Copper is added to a feeding mechanism equipped with a friction resistance reducing device to avoid scratches on a copper solder strip. (2) Flux coating: A manufactured copper base material is immersed in flux. Raw materials are an organic solvent, rosin resin and a derivative thereof, a synthetic resin surfactant, an organic acid activator, an anti-corrosive agent, a co-solvent, and a film-forming agent. (3) Tin and tin lead coating: The copper base material after immersion in the flux is immersed in a tin furnace. Tin-coating of the solder strip is to coat an outer surface of the copper base material with a layer of tin lead alloy, in order to form an alloy and reduce a soldering temperature of the solder strip. (4) Lubrication protectant: Solder layers on surfaces of tin and its alloy coating, pinholes, holes, pores, are effectively filled with the lubrication protectant, playing a better protective role. (5) Preparation of materials of the moisture barrier layer: A fluorine-containing material is used to form a uniform mixture under a high-temperature condition. (6) Moisture barrier layer: Local protection is formed by using a mold or partial bonding to a high-temperature non-stick material, so as to add the moisture barrier layer to the surface of the solder strip. (7) Drying treatment: The solder strip with the moisture barrier layer is dried and cooled. (8) The solar cell and the solder strip are heated and soldered by a stringer, and a normal process can meet requirements. Based on the above, the photovoltaic solder strip body after using the above moisture barrier layer can prevent corrosion of the photovoltaic solder strip body by acidic substances or oxidizing mediums in the photovoltaic module, so as to prevent degradation of electrical performance caused by entry of metal salts formed after corrosion of lead and tin in the solder strip into the solar cell.

The above solution is described in detail below with two embodiments.

Embodiment 1: The moisture barrier layer was made from hexafluoropropylene copolymer (FEP) and PVDF materials, immersed or sprayed at 300° C. The moisture barrier layer had a thin-film thickness in a range of 15 µm to 20 µm, transmittance of 88% to 90%, and a melting point of 255° C. to 260° C. A soldering operation temperature was 240° C. to 245° C. An EVA packaging material was used to manufacture a module, and DH1000 and DH3000 were conducted to test power attenuation.

Embodiment 2: The moisture barrier layer was made from a tetrafluoroethylene-ethylene copolymer. The moisture barrier layer had a thickness in a range of 25 µm to 30 µm. The moisture barrier layer was immersed or sprayed at 300° C., had transmittance of 90% to 92%, a melting point of 255° C. to 260° C., and a soldering operation temperature of 235° C. to 240° C. An EVA packaging material was used to manufacture a module, and DH1000 and DH3000 were conducted to test power attenuation. Results were shown in Table 1. Table 1 was a table of comparisons between test results of Embodiment 1, Embodiment 2, and a conventional solder strip.

TABLE 1

| Solution | DH1000 attenuation | DH3000 attenuation |
|---|---|---|
| Conventional solder strip | 3.5% | 7.8% |
| Embodiment 1 | 2.7% | 4.5% |
| Embodiment 2 | 1.9% | 3.9% |

The above data shows that, after the addition of the moisture barrier layer, corrosion of the photovoltaic solder strip body by acidic substances and oxides inside the module was reduced, further corrosion of reaction products such as lead and tin metal salts on the electrode of the solar cell and the interior was reduced, and DH resistance attenuation of the module was reduced. When the module was manufactured by using the solder strip with the moisture barrier layer, after 1000 h of DH test, power attenuation of the module was below 2.5%, and after 3000 h of DH test, the power attenuation of the module was below 5%, which can better meet requirements of reliability test and bring a better DH resistance attenuation effect. Moreover, the moisture barrier layer had a relatively large thickness. Therefore, an overall cost of the photovoltaic solder strip was not increased significantly.

According to some embodiments, the present disclosure further provides a photovoltaic module. The photovoltaic module includes a plurality of solar cells connected by solder strips. The solder strip is the barrier-type photovoltaic solder strip capable of reducing damp-heat (DH) attenuation as described in the above embodiments.

The above descriptions of the disclosed embodiments are provided to enable those skilled in the art to implement or use the present disclosure. Various modifications to these embodiments will be readily apparent to those skilled in the art, and the generic principles defined herein may be implemented in other embodiments without departing from the scope of the present disclosure. Therefore, the present disclosure will not be limited to the embodiments shown herein, but is to conform to the broadest scope consistent with the principles and novel features disclosed herein.

What is claimed is:

1. A barrier-type photovoltaic solder strip for a photovoltaic module comprising at least one solar cell, wherein the barrier-type photovoltaic solder strip is capable of reducing damp-heat (DH) attenuation and comprises a photovoltaic solder strip body and a moisture barrier layer provided on a surface of the photovoltaic solder strip body that is not to be in contact with an electrode of the at least one solar cell,
wherein a material of the moisture barrier layer comprises tetrafluoroethylene-hexafluoropropylene-vinylidene fluoride copolymer (THV) with a mass percentage in a range of 20% to 55%, polyvinylidene fluoride (PVDF) with a mass percentage in a range of 10% to 45%, polyvinyl fluoride (PVF) with a mass percentage in a range of 20% to 35%, and ethylene-chlorotrifluoroethylene copolymer (ECTFE) with a mass percentage in a range of 10% to 30%.

2. The barrier-type photovoltaic solder strip according to claim 1, wherein a thickness of the moisture barrier layer ranges from 1 μm to 50 μm.

3. The barrier-type photovoltaic solder strip according to claim 2, wherein the thickness of the moisture barrier layer ranges from 10 μm to 20 μm.

4. The barrier-type photovoltaic solder strip according to claim 1, wherein the photovoltaic solder strip body has a triangular section, and the moisture barrier layer is wrapped around two surfaces of the photovoltaic solder strip body.

5. The barrier-type photovoltaic solder strip according to claim 1, wherein the photovoltaic solder strip body has a circular section, and the moisture barrier layer is wrapped around at least three quarters of the photovoltaic solder strip body.

6. The barrier-type photovoltaic solder strip according to claim 1, wherein the photovoltaic solder strip body has a rectangular section, and the moisture barrier layer is wrapped around two minor surfaces and one major surface of the photovoltaic solder strip body.

7. A photovoltaic module, comprising:
solar cells; and
solder strips connecting between the solar cells, wherein at least one of the solder strips is a barrier-type photovoltaic solder strip capable of reducing damp-heat (DH) attenuation, and comprises a photovoltaic solder strip body, wherein a moisture barrier layer provided on a surface of the photovoltaic solder strip body that is not in contact with an electrode of the solar cells,
wherein a material of the moisture barrier layer comprises tetrafluoroethylene-hexafluoropropylene-vinylidene fluoride copolymer (THV) with a mass percentage in a range of 20% to 55%, polyvinylidene fluoride (PVDF) with a mass percentage in a range of 10% to 45%, polyvinyl fluoride (PVF) with a mass percentage in a range of 20% to 35%, and ethylene-chlorotrifluoroethylene copolymer (ECTFE) with a mass percentage in a range of 10% to 30%.

* * * * *